(12) United States Patent
Aoki

(10) Patent No.: US 7,626,841 B2
(45) Date of Patent: Dec. 1, 2009

(54) CONTENT DATA STORAGE DEVICE AND ITS CONTROL METHOD

(75) Inventor: Toshiaki Aoki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 125 days.

(21) Appl. No.: 12/020,979

(22) Filed: Jan. 28, 2008

(65) Prior Publication Data

US 2008/0232166 A1 Sep. 25, 2008

(30) Foreign Application Priority Data

Mar. 19, 2007 (JP) ............................. 2007-071383

(51) Int. Cl.
*G11C 15/00* (2006.01)
(52) U.S. Cl. ............. 365/49.1; 365/185.17; 365/230.06
(58) Field of Classification Search ................ 365/49.1, 365/185.17, 230.06
See application file for complete search history.

(56) References Cited

U.S. PATENT DOCUMENTS 5,734,919 A * 3/1998 Walsh et al. ........... 365/185.13

6,078,520 A * 6/2000 Tobita et al. ........... 365/185.09
2004/0190330 A1* 9/2004 Iwata ......................... 365/149

FOREIGN PATENT DOCUMENTS

JP 10-13777 1/1998
JP 2005-352899 12/2005

* cited by examiner

*Primary Examiner*—Tuan T. Nguyen
(74) *Attorney, Agent, or Firm*—Finnegan, Henderson, Farabow, Garrett & Dunner, L.L.P.

(57) ABSTRACT

A content data storage device which stores content data in nonvolatile memories from which data is erasable in units of blocks includes a bus width conversion unit converting a transmission bus to buses of a plurality of systems, a storage unit including a plurality of sets of memories, a plurality of switching units selectively switching between derivation of the content data and derivation of command signals and addresses, a controller configuring to perform (i) conversion control, (ii) state control, (iii) supply control, and (iv) switching control, the controller controlling the operation for reading and writing the content data with reference to the nonvolatile memories, and, a plurality of switch on and off units selectively switching on or off the content data, the command signals and the addresses.

14 Claims, 4 Drawing Sheets

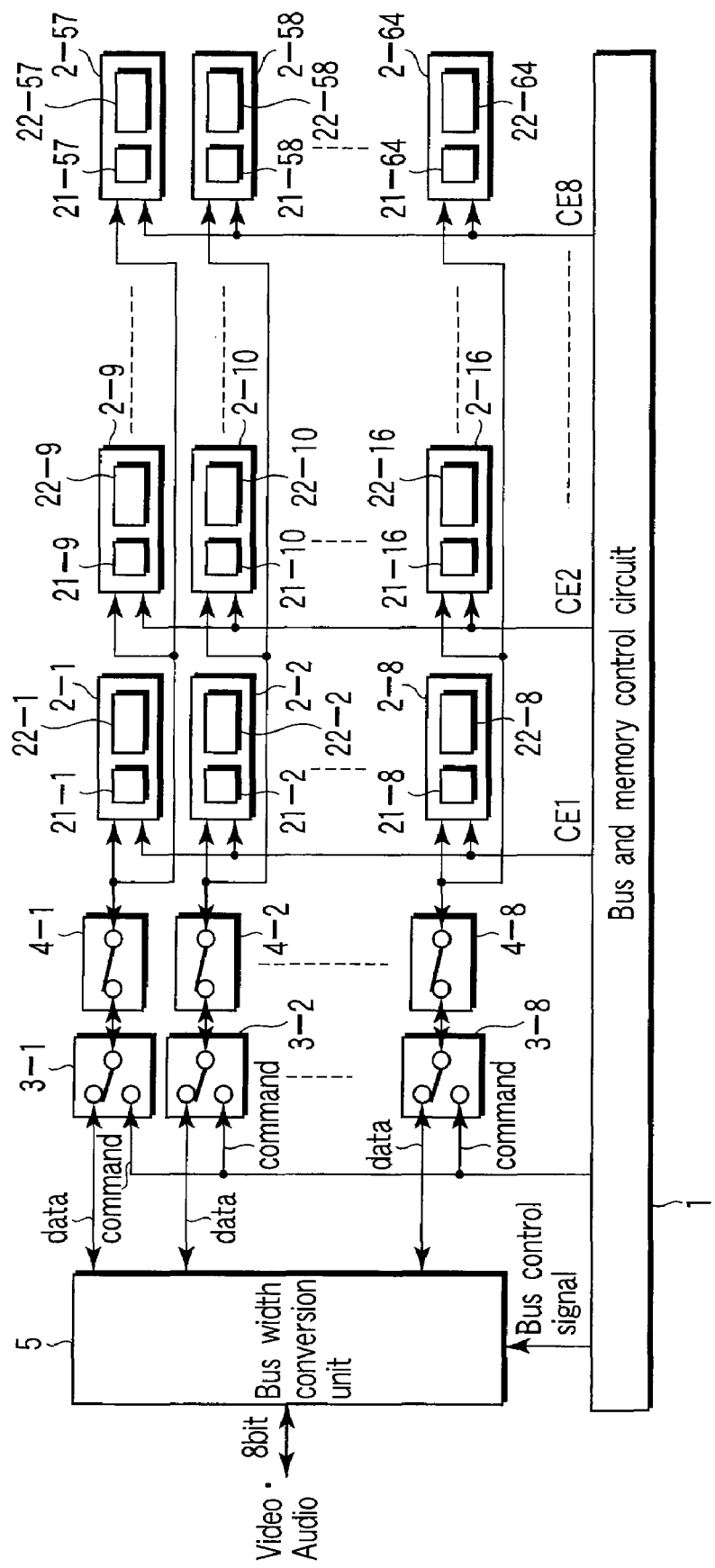
F I G. 1

CONTENT DATA STORAGE DEVICE AND ITS CONTROL METHOD

CROSS-REFERENCE TO RELATED APPLICATIONS

This application is based upon and claims the benefit of priority from prior Japanese Patent Application No. 2007-071383, filed Mar. 19, 2007, the entire contents of which are incorporated herein by reference.

BACKGROUND OF THE INVENTION

1. Field of the Invention

The present invention relates to a content data storage device which uses a nonvolatile memory, like a NAND flash memory, to erase data in block units and stores content data, such as video and audio, and relates to a control method of the storage device.

2. Description of the Related Art

A NAND flash memory that is a nonvolatile memory is characterized by large capacity and low price. Therefore, the NAND flash memory is widely used for a digital camera, a digital audio player, etc. NAND flash memory has characteristics such as its writing rate is slow and the size of a block that is the erasing unit of stored content data is large. For using the NAND flash memory as a consumer electronic device, the characteristics do not make matter. However, for using the NAND flash memory to a content data storage device for broadcasting, the characteristics should be considered to be improved.

Generally, the content data storage device needs to erase the data stored therein for each content item. Therefore, the content data storage device stores one item of content data in a storage space in the NAND flash memory, of which a capacity is integral multiple of its one block size. If the content data is one with a wide band like a moving image, the capacity of the content data is larger than the block size of the NAND flash memory. Thus, the waste of the capacity of the NAND flash memory is low through a method of storing the content data in the storage space in the NAND flash memory having the capacity of integral multiple of the block size. On the other hand, if the content data is one with a narrow band, like a still image and audio, etc., the capacity of the content data is smaller than the block size. Thereby, the waste of the capacity of the NAND flash memory is large through the aforementioned method when the narrow-band content item is written in the storage space.

If the content data is audio, because the capacity thereof is small, the content data storage device cannot write any data in the NAND flash memory until an audio data of one page that is a writing unit is supplied. Since the writing rate of the NAND flash memory is slow, even when inputting audio data has been terminated, the content data storage device does not terminate the writing immediately. That is, in the case of use of the content data storage device in a situation in which the content data includes a moving image of a wide band-content items, audio and a still image of a narrow-band content items, if there are many narrow-band content items, it turns into an issue that the use efficiency of the NAND flash memory is extremely deteriorated and the writing speed of the content date becomes slow.

Meanwhile, as for a method of compensating the low speed of the writing in the NAND flash memory in the conventional content data storage device, connecting a plurality of NAND flash memories in parallel is proposed. However, since the connecting the plurality of NAND flash memories in parallel enlarges the block size that is the erasing unit of the content data storage device in comparison with the case of a single memory IC, the size of the block that is a matter in writing data in the NAND flash memory becomes serious.

An example, which effectively utilizes a memory area of a storage medium by recording moving images in clusters of large sizes and still images in clusters of small sizes in recording the moving images and the still images in the storage medium, has been disclosed (e.g., refer to Jpn. Pat. Appln. KOKAI Publication No. 2005-352899).

An example, which effectively utilizes a partially unoccupied memory by setting identification codes corresponding to writing and reading units for audio data and video data to manage each data, has been disclosed (e.g., refer to Jpn. Pat. Appln. KOKAI Publication No. 10-13777).

BRIEF SUMMARY OF THE INVENTION

This invention is made under the foregoing circumstances, and an object of the invention is to provide a content data storage device configured to store content data at a high speed rate and also drastically improve memory use efficiency when content data includes wide-band content items and narrow-band content items, and a control method of the storage device.

According to a content data storage device regarding the invention, there is provided a content data storage device which stores content data in nonvolatile memories from which data is erasable in units of blocks, comprising: a bus width conversion unit which converts a transmission bus of the content data to buses in the system; a storage unit which includes a plurality of sets of memories where the nonvolatile memories are connected to the buses in the system, respectively; a plurality of switching units provided for the buses of the plurality of systems and selectively switching between derivation of the content data and derivation of command signals and addresses that instruct read and write operations; a controller configured to perform (i) conversion control by which the bus width of the bus width conversion unit is converted, (ii) state control by which the nonvolatile memory of a given one of the sets of the memories is switched into an active state, (iii) supply control by which the command signals and the addresses are supplied to the storage unit, and (iv) switching control by which the switching units are selectively switched, the controller controlling the operation for reading and writing the content data with reference to the nonvolatile memories when the nonvolatile memories are in the active state; and a plurality of switch on and off units provided for the buses of the plurality of systems and selectively switches on or off the content data, the command signals and the addresses derived from the plurality of switching units.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a block diagram depicting an exemplary configuration of an embodiment of a content data storage device regarding the present invention;

DETAILED DESCRIPTION OF THE INVENTION

Figure 2:
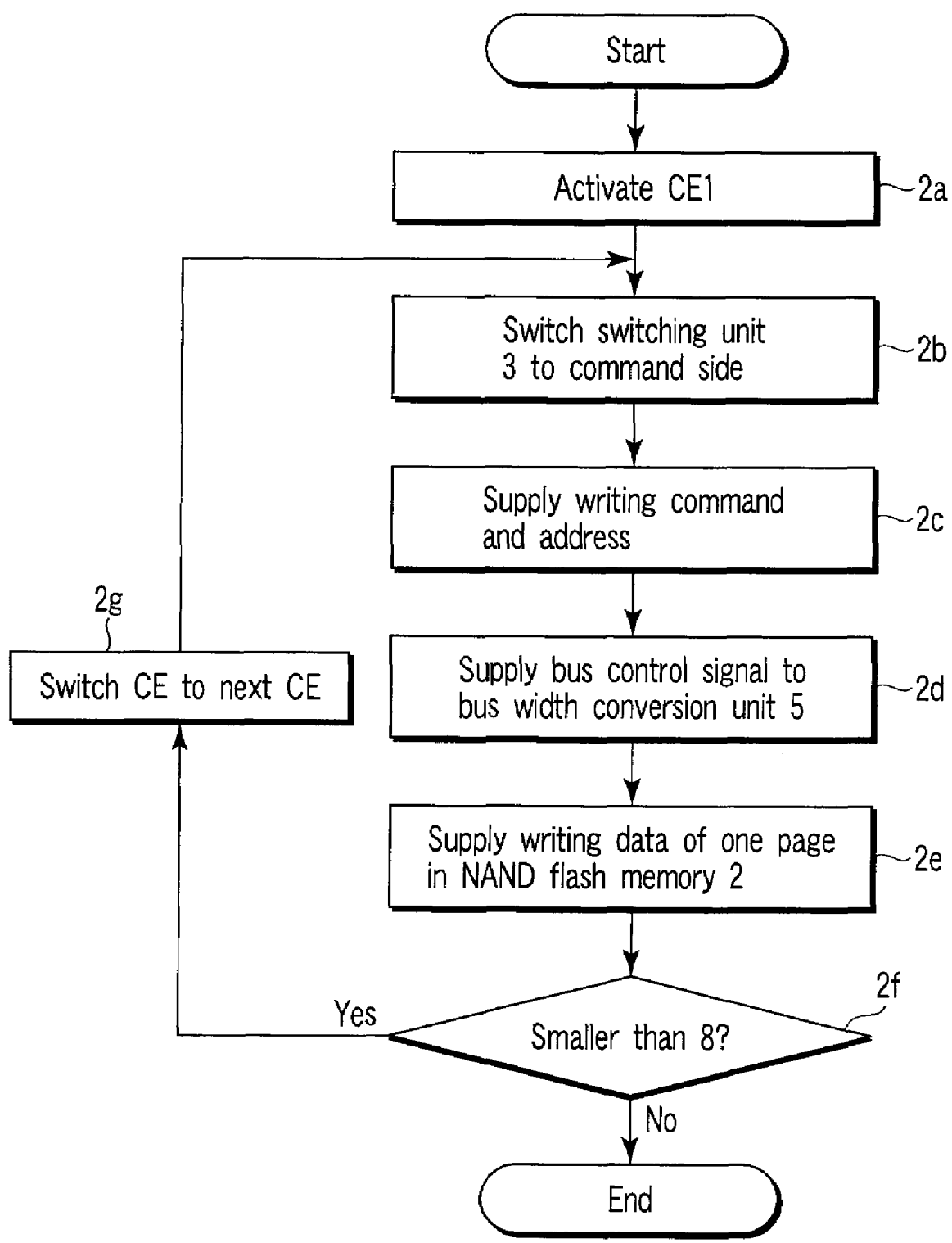
FIG. 2 is a flowchart depicting processing operations of a bus and memory control circuit of the embodiment.

The following will describe embodiments of the present invention in detail with reference to the drawings. A transmission speed of moving images to be stored in the embodiment will be described by taking a transmission speed of 96 Mbps as an example. Generally, in storing the moving image, data is treated in units of frame. Converting a data capacity of the transmission speed of 96 Mbps to a data capacity for each frame (one frame is equal to about 33 ms), 96 Mbps is equal to 12 MB/s and also to 400 kB/frame (B represents bytes).

Each parameter of the NAND flash memories to be used in the embodiment is as follows:
 Capacity: 4 Gbit
 Writing unit: one page=2,048 B
 Easing unit: one block=64 page=131,072 B
 Writing time: 0.7 ms
 Reading time: 0.1 ms.

Input and output conditions of the content data storage device to be used in the embodiment are as follows:
 Writing: 1 channel
 Reading: 10 channels.

As given above, it takes 0.7 ms to write data of one page (2,048 B) in the content data storage device using the NAND flash memory. Therefore, it takes 137.2 ms to write data of 400 kB in the NAND flash memory. Since the content data storage device simultaneously performs writing and reading, adding the reading time of 10 channels of 19.6 ms for the data of 400 kB from the NAND flash memory it is required to take 333.2 ms for writing and reading. Therefore, it is impossible for the content data storage device to write and read the data of 400 kB within one frame in and from one NAND flash memory. At this moment, for example, if 11 NAND flash memories are connected in parallel, the sum of the writing time and the reading time is equal to 30.3 ms, the content data storage device can write and read the moving image of 400 kB/frame within one frame.

Considering to pre/post-processing of reading-writing time, and for other signal processing time, and it is easy to handle if the NAND flash memories which are connected in parallel of the number of n-th power of 2. Thus, in the embodiment, 64 NAND flash memories are connected in parallel. In this case, if 64 NAND flash memories being still of 8-bit data bus are connected in parallel, pre and post processing time of writing and reading in and from NAND flash memories may not be ignored, and use efficiency in terms of time is deteriorated. Therefore an 8-bit bus is converted to a 64-bit bus in bus width, and the NAND flash memories are divided into eight sets for each eight pieces to be connected in parallel. Since 64 NAND flash memories of each having 4 Gbit are used in this embodiment, the entire capacity of the NAND flash memories is equal to 32 GB. If 32 GB capacity is not enough as for the content data storage device, continuously increasing addresses for each 32 GB makes it possible to increase the capacity of the content data storage device while assuring performance of high-speed writing and reading for the moving image.

FIG. 1 shows a block diagram depicting a configuration of a content data storage device regarding an embodiment of the invention. Command signals and addresses are supplied from a bus and memory control circuit 1 to NAND flash memories 2 of which the chip enable (CE) is activated by an instruction from the control circuit 1 through switching units 3-1 to 3-8 and switches 4-1 to 4-8 in the content data storage device shown in FIG. 1. In the content data storage device, when the command signals and addresses are supplied to the NAND flash memories 2, a bus width conversion unit 5 outputs distributed content data to a 64-bit bus. The content data storage device writes the video data in the NAND flash memories 2 the CE of which are activated.

If the capacity of 32 GB as for the content data storage device is not enough, the storage device can enlarge its capacity by increasing the NAND flash memories 2 in 64-piece units, and also by making the control circuit 1 treat address management.

Hereinafter, processing operations of the bus and memory control circuit 1 configured given above will be described.

FIG. 2 shows a flowchart depicting processing operations of the control circuit 1 regarding the embodiment of the invention.

At first, when writing moving images that are wide-band content items in NAND flash memories 2-1 to 2-64, the control circuit 1 sets all the switches 4-1 to 4-8 into on states as initial setting. In the states, the control circuit 1 executes the following processing. The control circuit 1 firstly activates the CE1 of the NAND flash memories 2-1 to 2-8 (Block 2*a*). The control circuit 1 then switches the switch units 3-1 to 3-8 to command sides (Block 2*b*). The control circuit 1 supplies writing commands and addresses to the NAND flash memories 2 (Block 2*c*).

The control circuit 1 switches the switch units 3-1 to 3-8 to data sides with the CE of the NAND flash memories 2-1 to 2-8 being activated, and supplies a bus control signal to the bus width conversion unit 5 (Block 2*d*). Thereby, the conversion unit 5 supplies content data of one page to input buffers 21-1 to 21-8 of the NAND flash memories, respectively (Block 2*e*). Thus, the content data of one page is written in memory chips 22-1 to 22-8.

At this moment, it takes 0.7 ms for each NAND flash memory to write the content data of one page therein. Therefore, when the content data of one page is supplied to the input buffers 21-1 to 21-8, the control circuit 1 determines whether or not a number of the CE which has been activated before completion of writing in memory elements 22-1 to 22-8 is smaller than eight (Block 2*f*). If the number of the CE is smaller than eight (Yes, in Block 2*f*), the control circuit 1 switches the activated CE to the next CE (Block 2*g*) to advance to Block 2*b*. If the number of activated CE is eight or larger (No, in Block 2*f*), the control circuit 1 terminates a series of processing operations.

An example of a case of storing moving images, audio and still images in the content data storage device of the configuration given above will be described hereinafter.

Figure 3:
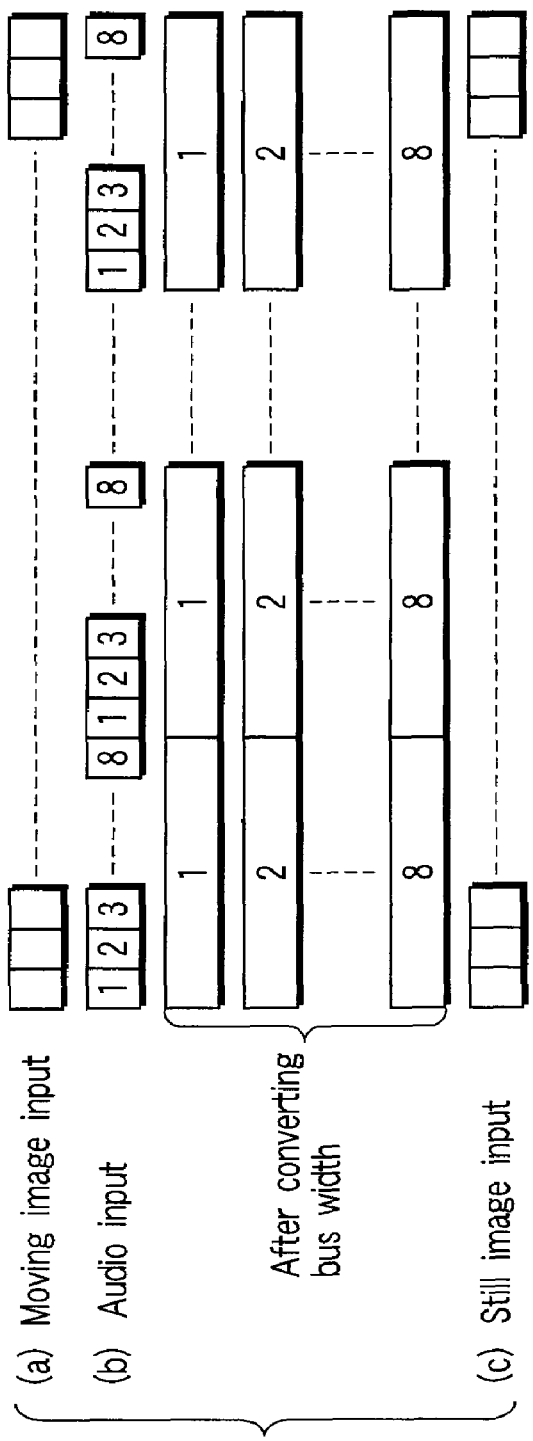
FIG. 3 is a schematic view depicting input states of content data of a moving image, voce and a still image of the embodiment.

FIG. 3 shows a schematic view schematically depicting each input of content data of the moving images, the audio and the still images regarding the embodiment of the invention. FIG. 3(*a*) shows the content data of the moving images to be input in the conversion unit 5, FIG. 3(*b*) shows the content data of the audio input in the conversion unit 5, and FIG. 3(C) shows the content data of the still images to be input in the conversion unit 5.

Since the moving images and the still images are frequently in each single channel (ch), signals to be input in the conversion unit 5 are uniform as shown in FIGS. 3(*a*), (*c*). In contrast, the audio data is frequently content in eight channels; each of the content data items of ch1 to ch8 is input by being laid side-by-side for each 1B and input in the conversion unit 5 as depicted in FIG. 3(*b*). When the content data for each channel is laid side-by-side for each 1B to be input in the conversion unit 5, the content data is divided into each channel as shown in FIG. 3(*b*) and output to each bus.

Writing the content data of the audio to be output from the bus width conversion unit 5 as given above in the NAND flash memories 2-1 to 2-64 in a state in which all the switches 4-1 to 4-8 are switched on, the content data in ch1 is written in the NAND flash memories 2-1, 2-9, . . . , 2-57. The content data in ch2 is written in the NAND flash memories 2-2, 2-10, . . . , 2-58. Like this, the content data of the audio in each channel is stored in eight NAND flash memories, respectively, as one content item.

In storing only content data of an audio in a specified channel, by switching on only the switch corresponding to the specified channel, the content data storage device can write only the content data of the audio in the specified channel in eight NAND flash memories. Similarly, the content data storage device can read and erase only the content data of the audio in the specified channel.

The content data storage device supplies the command signals and addresses to eight sets of the NAND flash memories simultaneously, and activates only one CE. Then the content data storage device writes the content data of the still image in the NAND flash memories. Since the data capacity of one still image is within the capacity to be enough stored in eight NAND flash memories, in the case, for example, in which the CE1 is activated, the content data of the still image is stored in the NAND flash memories 2-1 to 2-8.

While a method of minimizing the erasing unit of the content data storage device in different method for the content data of the audio and the still images has described, changing order of content items to be input in a time axis enables the audio and the still images being treated in the same control.

Figure 4:
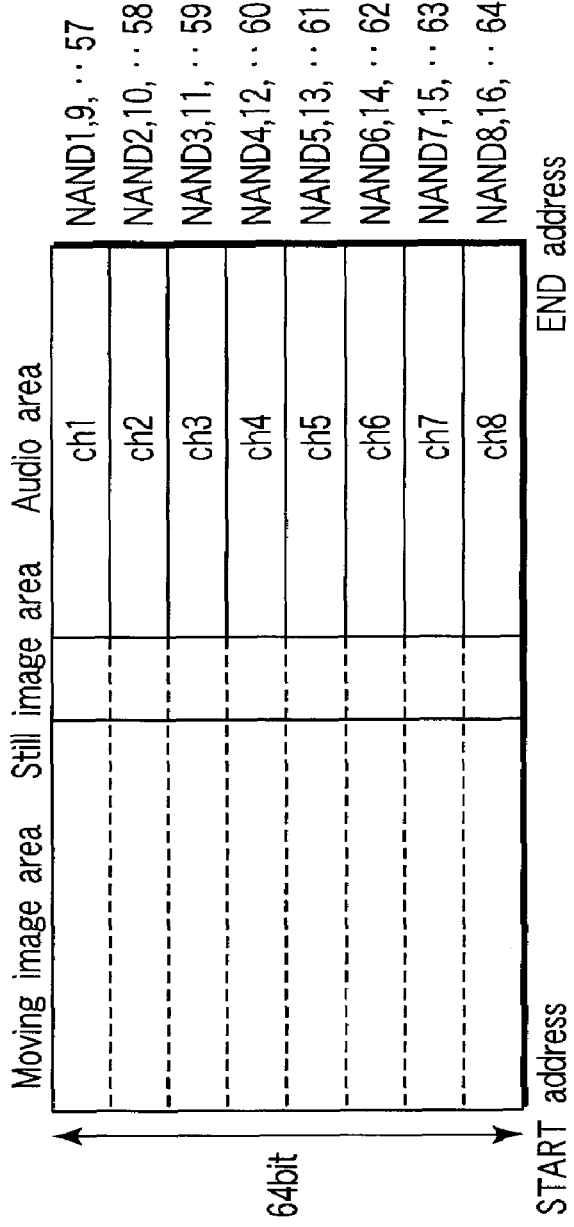
FIG. 4 is a schematic view depicting a storage area of video data in a NAND flash memories of the embodiment.

FIG. 4 is a schematic view illustrating a storage area of content data on NAND flash memories. The content data storage device includes the NAND flash memories 2-1 to 2-64 the capacities of which are divided in advance in accordance with use prospects by the moving images, still images and audio. In storing the content data, each of storage areas stores the content data of the moving images, still images and audio.

While the description given above has described the writing of the moving images, audio and still images in the NAND flash memories 2, the content data storage device can read and erase them from the NAND flash memories 2 by similar control to that of the writing.

In actual operations of the content data storage device, the use rates of the storage areas on the NAND flash memories 2 for the moving image, the still image and the audio are not decided in advance. In such a case, the capacities of the NAND flash memories 2-1 to 2-64 are divided into three areas in accordance with use prospects of the moving image, still image and audio. However, if the use prospects assumed beforehand and the actual use are extremely different from each other, any of the storage areas is fully occupied in first. Therefore, even if there is a space in terms of a whole of the storage area in the content data storage device, there is the possibility that the storage device may not write the content data therein. Thus, if the use rates of the storage areas for the moving image, the still image and the audio are not decided beforehand, the bus and memory control circuit 1 controls the writing of the content data in the NAND flash memories 2-1 to 2-64 in order to effectively utilize the whole of the storage area, as shown in FIG. 5(*a*).

In writing the wide-band content items of the moving images, the control circuit 1 assigns the START address of the NAND flash memories 2. Then, the control circuit 1 supplies writing commands and addresses to the NAND flash memories 2 in the direction from the START address toward the END address. By supplying the writing commands and addresses to the flash memories in this manner, the content data storage device writes the wide-band content items in the NAND flash memories 2. Thereby, the wide-band content items are stored in an arrow H direction from an A point. In contrast, in writing the narrow-band content items, such as still images and audio, the control circuit 1 assigns the END address of the NAND flash memories 2. Then, the control circuit 1 supplies writing commands and addresses to the NAND flash memories 2 in a direction from the END address to the START address. By supplying the writing commands and the addresses to the NAND flash memories 2 in this manner, the content data storage device writes the narrow-band content items in the NAND flash memories 2. Thereby, the narrow-band content items are stored in an arrow L direction from a B point, as depicted in FIG. 5(*a*).

Figure 5:
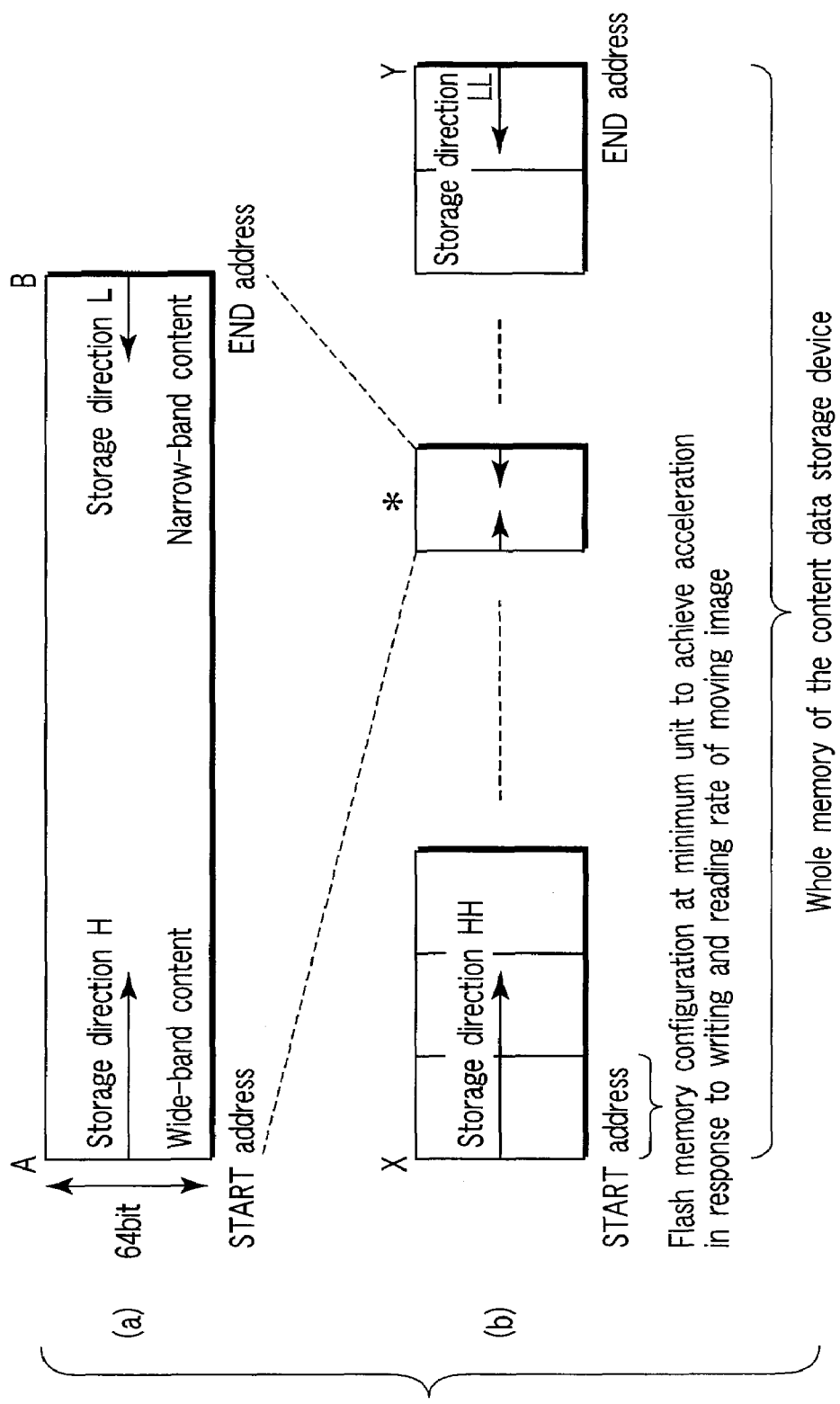
FIG. 5 is a schematic view depicting a method for writing the content data in the NAND flash memories of the embodiment.

Employing the method of writing in FIG. 5(*a*), only one empty area is made in the whole of the storage area on the NAND flash memories 2. Thereby, managing only one empty area enables automatically distributing the storage areas in response to storage capacities of each item of content data without managing the empty areas intricately. Therefore, the whole of the storage area on the NAND flash memories 2 can be effectively used.

Although the foregoing example has described the case in which the wide-band content items are written in the direction starting from the START address up to the END address and the narrow-band content items are written in the direction starting from the END address up to the START address, the same effects are produced by writing the wide-band content items in the direction starting from the END address up to the START address and the narrow-band content items in the direction starting from the START address up to the END address.

While FIG. 5(*a*) shows an example of the case of 64 NAND flash memories, in a content data storage device with a large capacity, which has a plurality of sets of units of flash memories of a minimum unit to actualize acceleration in response to writing and reading rates of moving images, and secures a necessary capacity, the writing method is established as shown in FIG. 5(*b*), and the same effects are produced. Here, if the flash memory of the content data storage device has a larger structure than that of the minimum unit, only a unit at a position of * mark in FIG. 5(*b*) is equal to the writing method shown in FIG. 5(*a*). On other units, for example, the wide-band content items are stored in a direction from a START address to an END address, namely an arrow HH direction from an X point. The narrow-band content items are stored in a direction from the END address to the START address, namely in an arrow LL direction from a Y point.

As mentioned above, in the foregoing embodiment, the content data storage device stores the moving images in the 64 NAND flash memories connected in parallel, by switching on all the switches 4-1 to 4-8 and by activating the CE in turn. The storage device stores the audio in the respective channels in the eight NAND flash memories connected to the same bus and arranged in parallel, by outputting the respective audio in each channel to each bus by means of the bus width conversion unit 5. The storage device stores the audio in the specified channels in the eight NAND flash memories connected in parallel by switching on only the switches 4-1 to 4-8 corresponding to the specified channels. Further, the storage device stores the still images in the eight NAND flash memories connected to each bus and arranged in parallel, by simultaneously supplying the command signals and the addresses to the eight NAND flash memories and by activating only one CE.

Thereby, in comparison with the erasing unit of the content data storage device in storing the moving images, since the erasing unit of the content data storage device in storing the audio and the still images is equal to ⅛, the memory use rate of the storage device is equal to 8 times as high as the case of storing audio by the method same as the moving images. Therefore, even in the content data storage device in the case in which the content data includes the moving images, the audio and the still images, the memory use efficiency can be improved.

Accordingly, by changing the number of the NAND flash memories connected in parallel for each content data item to be stored, even when storing the data in which the wide-band content data and the narrow-band content data coexist, a content data storage device capable of storing data at high speed and achieving a high memory use rate can be actualized. According to this content data storage device, since the storage device stores the audio in each channel in eight NAND flash memories connected in parallel, respectively, the changing of the audio for each channel is easily performed.

The invention is not limited to the foregoing embodiment. For instance, while the aforementioned embodiment has described the example in which the storage device stores the moving images of 96 Mbps by using 64 NAND flash memories, the same can be applied to the case in which the number of the NAND flash memories is not 64 and the transmission rate of the moving image is not equal to 96 Mbps.

While the aforementioned embodiment has described the example in which the audio is transmitted through eight channels, the same can be applied to the case other than the number of channels is eight by adjusting the bus width conversion unit 5.

Further, in an implementation phase, the invention may be embodied by modifying constituent elements without departing from the spirit of the concept thereof. Various types of the invention can be formed by appropriately combining a plurality of constituent elements disclosed in the foregoing embodiments. Some of the elements, for example, may be omitted from the whole of the constituent elements shown in the embodiments mentioned above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A content data storage device which stores content data in nonvolatile memories from which data is erasable in units of blocks, comprising:
    a bus width conversion unit which converts a transmission bus of the content data to buses of a plurality of systems;
    a storage unit which includes a plurality of sets of memories where the nonvolatile memories are connected to the buses of the plurality of systems, respectively;
    a plurality of switching units provided for the buses of the plurality of systems and selectively switching between derivation of the content data and derivation of command signals and addresses that instruct read and write operations;
    a controller configured to perform (i) conversion control by which the bus width of the bus width conversion unit is converted, (ii) state control by which the nonvolatile memory of a given one of the sets of the memories is switched into an active state, (iii) supply control by which the command signals and the addresses are supplied to the storage unit, and (iv) switching control by which the switching units are selectively switched, said controller controlling the operation for reading and writing the content data with reference to the nonvolatile memories when the nonvolatile memories are in the active state; and
    a plurality of switch on and off units provided for the buses of the plurality of systems and selectively switches on or off the content data, the command signals and the addresses derived from the plurality of switching units.

2. The content data storage device according to claim 1, wherein the controller performs the state control to switch one of the sets of the memories into the active state, performs the supply control to supply the command signals and the addresses to the storage unit, performs the switching control to switch the switching units from derivation of the command signals and the addresses to derivation of the content data, and performs the conversion control to change the bus width and output the content data to the storage unit, thereby writing the content data in the nonvolatile memory that is in the active state.

3. The content data storage device according to claim 1, wherein the switch on and off units selectively switch on and off the content data, the command signals and the addresses derived from the switching units, thereby changing the number of nonvolatile memories belonging to the sets of the memories of the storage unit.

4. The content data storage device according to claim 1, wherein the storage unit stores the content data only in nonvolatile memories which are among the nonvolatile memories of the sets of the memories and which are of the same systems in which connections of the memories are maintained by selective on-processing performed by the plurality of switch on and off units, and uses size of blocks of the nonvolatile memories of the same systems as erasing units.

5. The content data storage device according to claim 1, wherein: when the content data is audio data of a plurality of channels,
    the bus width conversion unit distributes the audio data to the buses of the plurality of systems for each channel;
    the switch on and off units switch on only derivation to systems specified by the switch on off instructions; and
    the storage unit stores the audio data of channels to be derived into the specified systems in the nonvolatile memories which are included among the sets of memories and which are connected to the specified systems.

6. The content data storage device according to claim 1, wherein:
    the controller performs the state control by which states of nonvolatile memories of any one of the sets of memories are selectively controlled; and
    the storage unit stores the content data only in the nonvolatile memories brought into the active states and uses size of the blocks of the nonvolatile memories brought into the active state as erasing units.

7. The content data storage device according to claim 1, wherein:
the content data includes a wide-band content and a narrow-band content; and
the capacities of the plurality of nonvolatile memories of the storage unit are divided in advance for each of the wide-band content and the narrow-band content of the content data on the basis of use capacities of the wide-band content and the narrow-band content to be prospected when the content data is stored.

8. The content data storage device according to claim 1, wherein:
the content data includes a wide-band content and a narrow-band content;
the storage unit includes a first group to an N-th group as memories of the plurality of sets; and
the controller performs control by which one of the wide-band content and the narrow-band content is written from the first group in a forward direction and the other content is written from the N-th group in an inverse direction.

9. A control method for use in a content data storage device which stores content data in nonvolatile memories from which data is erasable in units of blocks, said control method comprising:
switching nonvolatile memories, which are included among a plurality of memories having the nonvolatile memories connected to a plurality of buses, into an active state;
supplying command signals and addresses that instruct a write operation and a read operation;
switching from derivation of the command signals and the addresses to derivation of the content data when the command signals and the addresses are supplied to the nonvolatile memories that are in the active state; and
expanding a bus width of a transmission bus of the content data to buses of the plurality of systems, and then writing the content data in the nonvolatile memories that are in the active state.

10. The control method according to claim 9, wherein the number of nonvolatile memories belonging to the memories is changed by selectively switching on and off the content data, the command signals and the addresses to be supplied, in accordance with switch on and off instructions.

11. The control method according to claim 9, further comprising: when the content data is audio data of a plurality of channels,
switching on derivation of the audio data, the command signals and the addresses to specific systems specified in accordance with the switch on and off instructions;
distributing the audio data to the buses of the plurality of systems for each channel; and
storing the audio data of the channels derived into the specified systems in the nonvolatile memories which are included among the plurality of sets of the memories and which are connected to the specified systems.

12. The control method according to claim 9, wherein
the switching to the active state is selectively applied to any set of the nonvolatile memories included among the plurality of sets of the memories; and
determining the erasing units on the basis of size of blocks of the nonvolatile memories of the memories brought into the active state.

13. The control method according to claim 9, wherein:
the content data includes a wide-band content and a narrow-band content; and
the capacities of the nonvolatile memories are divided in advance for each of the wide-band content and the narrow-band content on the basis of use capacities of the wide-band content and the narrow-band content prospected when the content data is stored.

14. The control method according to claim 9, wherein the content data includes a wide-band content and a narrow-band content,
the plurality of sets of the memories include a first group to an N-th group; and
one of the wide-band content and the narrow-band content is written in a forward direction starting from the first group, and the other one is written in an inverse direction starting from the N-th group.

* * * * *